(12) United States Patent
Park

(10) Patent No.: US 7,358,534 B2
(45) Date of Patent: Apr. 15, 2008

(54) THIN FILM DISPLAY TRANSISTOR ARRAY SUBSTRATE FOR A LIQUID CRYSTAL DISPLAY HAVING REPAIR LINES

(75) Inventor: Woon-Yong Park, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 351 days.

(21) Appl. No.: 11/193,527

(22) Filed: Aug. 1, 2005

(65) Prior Publication Data

US 2005/0263772 A1 Dec. 1, 2005

Related U.S. Application Data

(63) Continuation of application No. 09/636,466, filed on Aug. 11, 2000, now Pat. No. 6,943,374.

(30) Foreign Application Priority Data

Aug. 12, 1999 (KR) .............................. 1999-33092

(51) Int. Cl.
*H01L 29/04* (2006.01)
*H01L 27/01* (2006.01)
*G02F 1/1333* (2006.01)

(52) U.S. Cl. .................. 257/72; 257/59; 257/347; 349/54

(58) Field of Classification Search .......... 257/72, 257/59, 347; 349/54
See application file for complete search history.

(56) References Cited

U.S. PATENT DOCUMENTS 5,475,246 A * 12/1995 Wei et al. ................. 257/291

(Continued)

FOREIGN PATENT DOCUMENTS

| KR | 1998-059993 | 10/1998 |
|---|---|---|
| KR | 1998-086041 | 12/1998 |

OTHER PUBLICATIONS

Korean Patent Abstracts, Publication No. 1019980059993, Oct. 7, 1998, 1 p.
Korean Patent Abstracts, Publication No. 1019980086041, Dec. 5, 1998, 1 p.

*Primary Examiner*—Ori Nadav
(74) *Attorney, Agent, or Firm*—MacPherson Kwok Chen & Heid LLP

(57) ABSTRACT

A thin film transistor array substrate for a liquid crystal display includes an insulating substrate with a display area and a peripheral area surrounding the display area. The peripheral area has an upper region above the display area and a lower region below the display area. Signal lines are formed on the substrate such that the signal lines are bundled into a plurality of blocks. Each block has a predetermined number of signal lines. A plurality of first upper repair lines is formed at the upper peripheral region of the substrate, crossing one or more blocks of the signal lines. A plurality of second upper repair lines is formed at the upper peripheral region of the substrate, crossing all of the signal lines. A plurality of first lower repair lines are formed at the lower peripheral region of the substrate, connected to the corresponding first upper repair lines. The first lower repair lines cross the signal lines crossed by the first upper repair lines. A plurality of second lower repair lines is formed at the lower peripheral region of the substrate, crossing all of the signal lines. A plurality of upper connection members crosses the first upper repair lines and the second upper repair lines. A plurality of lower connection members crosses the first lower repair lines and the second lower repair lines. In this structure, even though line breakage is concentrated at a particular area, such line breakage can be collectively repaired using the spare neighboring repair lines and interconnection lines interconnecting the repair lines efficiently.

5 Claims, 4 Drawing Sheets

U.S. PATENT DOCUMENTS

| | | | |
|---|---|---|---|
| 5,729,309 A | * | 3/1998 | Na et al. ........................ 349/54 |
| 5,859,679 A | * | 1/1999 | Song ............................ 349/54 |
| 5,969,779 A | * | 10/1999 | Kim et al. ..................... 349/54 |
| 6,078,369 A | * | 6/2000 | Kawamoto et al. ............ 349/54 |
| 6,111,558 A | * | 8/2000 | Jeung et al. ................... 345/93 |
| 6,111,621 A | * | 8/2000 | Kim et al. ..................... 349/54 |
| 6,380,992 B1 | | 4/2002 | Lee |
| 6,618,101 B1 | * | 9/2003 | Kim et al. ..................... 349/54 |

\* cited by examiner

THIN FILM DISPLAY TRANSISTOR ARRAY SUBSTRATE FOR A LIQUID CRYSTAL DISPLAY HAVING REPAIR LINES

CROSS REFERENCE TO PRIOR APPLICATIONS

This application is a continuation of application Ser. No. 09/636,466, filed Aug. 11, 2000, now U.S. Pat. No. 6,943,374, which claims priority to and the benefit of Korean Patent Application No. 1999-33092 filed on Aug. 12, 1999, which are all hereby incorporated by reference for all purposes as if fully set forth herein.

BACKGROUND OF THE INVENTION (a) Field of the Invention

The present invention relates to a thin film transistor (TFT) array substrate for a liquid crystal display and, more particularly, to a TFT array substrate having with repair lines.

(b) Description of the Related Art

Generally, liquid crystal displays are structured with a color filter substrate with a common electrode and color filters, a TFT array substrate with TFTs and pixel electrodes, and a liquid crystal sandwiched between the substrates. In operation, different voltages are applied to the common electrode and the pixel electrodes to form electric fields, and under the application of the electric fields, the molecular orientation of the liquid crystal changes. This controls light transmission and displays pictorial images on the screen.

The TFTs are connected to the pixel electrodes individually in order to switch the voltage applied to each pixel electrode.

Gate lines for transmitting scanning signals to the TFTs, and data lines for transmitting pictorial image signals to the TFTs are formed at the TFT array substrate. Such gate and data lines are easy to break or to be disconnected during the device fabricating process. In order to repair such a breakage or disconnection, repair lines are usually provided at the TFT array substrate.

Conventionally, one or two repair lines are formed at the target data lines or gate lines such that they cross both end portions of the data or gate lines. The repair lines are interconnected via lines formed at tape carrier packages (TCPs) and at a printed circuit board (PCB).

In the TFT array substrate with such repair lines, when lines (for example, data lines) are broken, a laser is irradiated to the crossed portion between the broken line and the repair line and both sides of the broken line are short-circuited by way of the repair line. In this way, pictorial image signals can be transmitted to the disconnected side of the data line via the repair line.

However, when one or two repair lines cross all of the gate lines or data lines, four broken lines may be repaired at most.

In order to repair more broken lines, it has been suggested that the lines connected to one driving integrated circuit (IC) be packaged into one block, and that a separate repair line be formed for each block.

However, such a technique involves several shortcomings.

First, in the usual TCPs, it is difficult to form as many pads as the number of repair lines. Furthermore, as the number of pads increases, the length of the TCPs for the gate driving IC should increase to be connected to the underlying repair lines. Consequently, TCPs having a special structure would be required, resulting in increased production cost. In addition, either as many interconnection lines for the repair lines should be formed at the PCB as the number of driving ICs, or twice as many. Therefore, the volume of the PCB would be increased, resulting in a larger device size.

SUMMARY OF THE INVENTION

It is an object of the present invention to provide a TFT array substrate for a liquid crystal display that can be fabricated in a cost-effective manner.

It is another object of the present invention to provide a TFT array substrate for a liquid crystal display of a minimum device size.

These and other objects may be achieved by a TFT array substrate for a liquid crystal display including an insulating substrate with a display area and a peripheral area surrounding the display area. The peripheral area has an upper region above the display area and a lower region below the display area. Signal lines are formed on the substrate such that the signal lines are bundled into a plurality of blocks, and each block has a predetermined number of the signal lines. A plurality of first upper repair lines are formed at the upper peripheral region of the substrate, crossing one or more blocks of the signal lines, and a plurality of second upper repair lines are formed at the upper peripheral region of the substrate, crossing all of the signal lines. A plurality of first lower repair lines are formed at the lower peripheral region of the substrate, connected to the corresponding first upper repair lines, and these first lower repair lines cross the signal lines crossed by the first upper repair lines. A plurality of second lower repair lines is formed at the lower peripheral region of the substrate, crossing all of the signal lines. A plurality of upper connection members crosses the first upper repair lines and the second upper repair lines, and a plurality of lower connection members cross the first lower repair lines and the second lower repair lines.

The first upper repair lines and the first lower repair lines may be interconnected via first dummy pads of TCPs and first interconnection lines of a PCB, and second dummy pads of the TCPs and second interconnection lines of the PCB may be further provided to interconnect the first upper and lower repair lines.

A plurality of third upper repair lines may be formed at the upper peripheral region of the substrate while crossing the upper connection members and all of the signal lines, and a plurality of third lower repair lines may be formed at the lower peripheral region of the substrate while crossing the lower connection members and all of the signal lines.

Each block of the signal lines may include the signal lines connected to one of the ICs, and the first upper and lower repair lines may cross two blocks of the signal lines. The signal lines may be data lines.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

Figure 1:
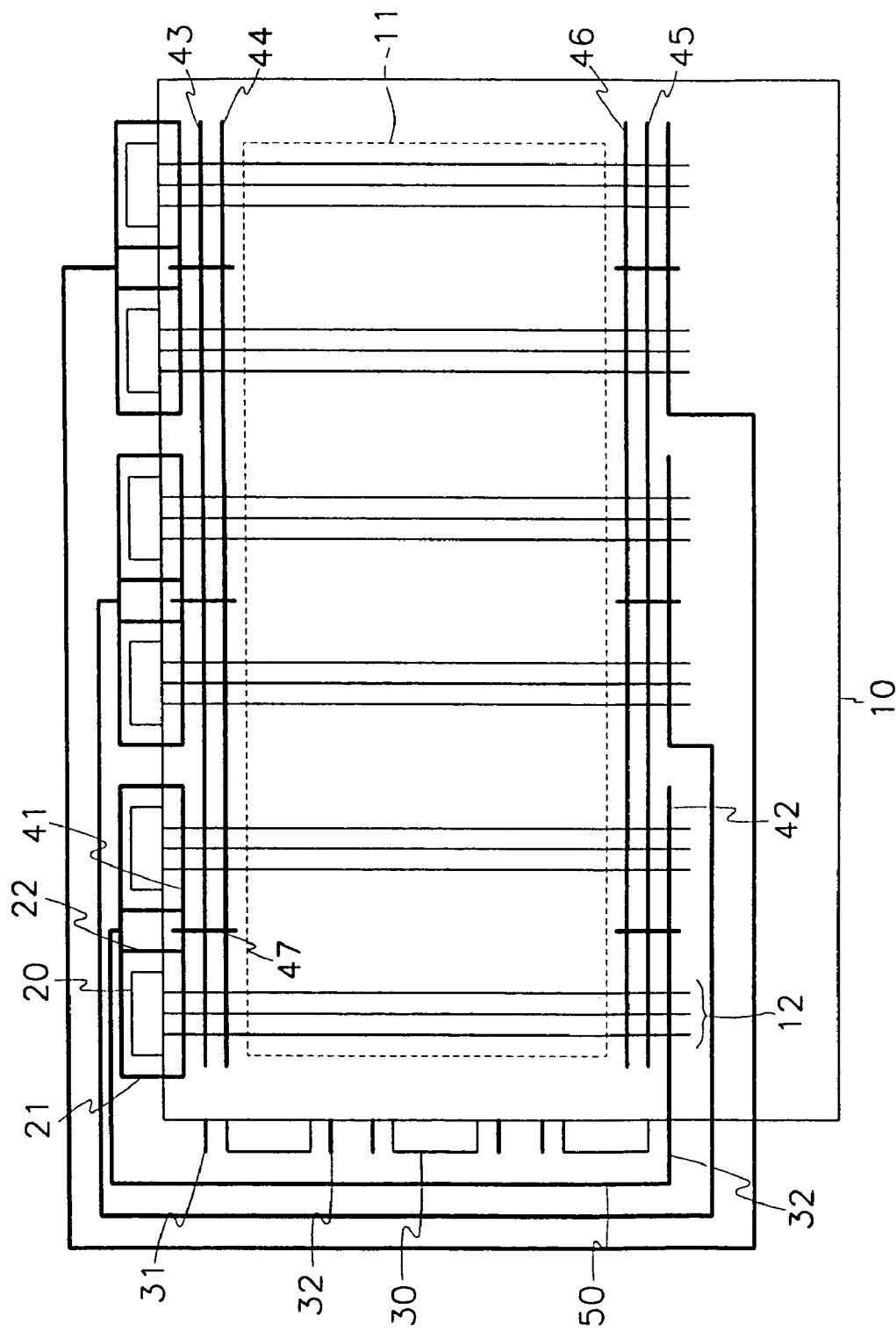
FIG. 1 is a circuit diagram of a TFT array substrate for a liquid crystal display according to a first preferred embodiment of the present invention.

FIG. 1 is a circuit diagram of a TFT array substrate for a liquid crystal display according to a first preferred embodiment of the present invention.

As shown in FIG. 1, a plurality of data lines 12 is formed on an insulating substrate 10 in the vertical direction. A plurality of gate lines (not shown) is formed on the substrate 10 in the horizontal direction. The data lines 12 cross the gate lines to thereby form a display area 11 where pictorial images are displayed. The substrate 10 has a peripheral area externally surrounding the display area 11. The peripheral area may be roughly divided into left, right, upper and lower regions with respect to the display area 11.

Driving ICs 20 and 30 are provided at the upper and left peripheral regions of the substrate 10 such that they are connected to the data lines 12 and the gate lines, respectively. The driving ICs 20 and 30 are mounted on the substrate 10 via TCPs, and dummy pins 21, 22, 31 and 32 are formed at the sides of the driving ICs 20 and 30.

Three kinds of repair lines are formed at the upper and lower peripheral regions of the substrate 10 such that they cross the data lines 12 while being insulated therefrom.

A set of three first repair lines 41 and another set of three first repair lines 42 are formed at the upper and lower peripheral regions respectively. The first repair lines 41 and 42 cross only the data lines 12 connected to two of the data driving ICs 20. The upper and lower repair lines 41 and 42 cross the same data line 12 as a pair. Of course, the number of the first repair lines 41 and 42 may be increased or decreased depending upon the number of the driving ICs. Furthermore, the first repair lines 41 and 42 may cross other than the data lines 12 connected to the two data driving ICs 20, if necessary.

The second repair line 43 and the third repair line 44 are formed at the upper peripheral region of the substrate 10, and the second repair line 45 and the third repair line 46 are formed at the lower peripheral region of the substrate 10, and they cross all of the data lines 12.

Furthermore, connection members 47 are formed at the substrate 10, crossing the first to third upper repair lines 41, 43 and 44 at the upper peripheral region, and at the first to third lower repair lines 42, 45 and 46 at the lower peripheral region. The number of the connection members 47 is as many as the number of the first repair lines 41 and 42, but may be increased as needed. For example, there may be as many connection members 47 as there are driving ICs 20.

Each pair of first upper and lower repair lines 41 and 42 formed at the upper and lower peripheral regions of the substrate 10 is interconnected via interconnection lines 50 formed at the PCB. The first repair lines 41 and 42 are linked to the interconnection lines 50 formed at the PCB via the dummy pins 21, 22 and 32 of the driving ICs, and dummy pads formed at the TCPs.

The first upper repair lines 41 are connected to all of the dummy pins 21 and 22 of the driving ICs 20 connected to the data lines 12 that they cross. The dummy pins 21 and 22 are bundled, and linked to the interconnection lines 50.

In the above structure, the number of interconnection lines 50 for interconnecting the upper and lower repair lines is significantly reduced so that the volume of the PCB can be minimized while decreasing the number of dummy pads for drawing the repair lines. This makes it possible to use common TCPs.

A signal amplifying circuit (not shown) may be added in the interconnection line 50 to compensate for signal retardation through amplifying the pictorial signals transmitted along the interconnection line 50.

Figure 2:
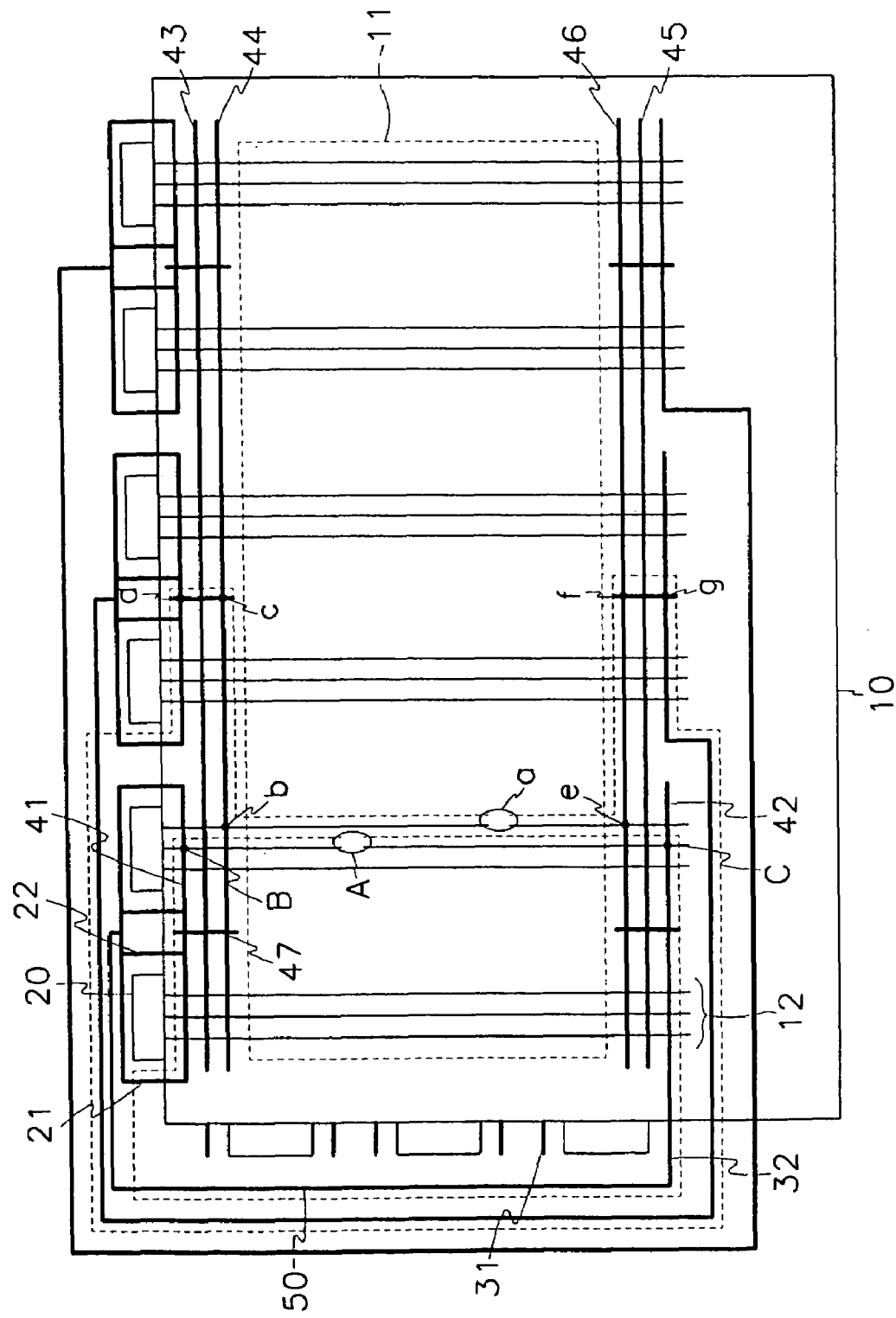
FIG. 2 illustrates the method of repairing broken lines at the TFT array substrate shown in FIG. 1.

FIG. 2 illustrates the method of repairing broken data lines at the TFT array substrate where two of the data lines 12 connected to one driving IC 20 are broken (at the A and a portions).

First, a laser beam is irradiated to the crossing points B and C between the first upper and lower repair lines 41 and 42 and the data line 12 broken at the A portion, and short-circuits them. As a result, the pictorial image signal started from the driving IC 20 is transmitted to the first upper repair line 41 at the short circuited portion B, and transmitted to the first lower repair line 42 via the dummy pad and dummy pin 21 of the TCP, and the interconnection line 50 of the PCB. The pictorial image signal is then transmitted to the side of the data line 12 below the broken portion A thereof via the short-circuited portion C.

In the meantime, the crossed portions b and e between the third upper and lower repair lines 44 and 46 and the data line 12 broken at the a portion, the crossing points d and g between the first repair lines 41 and 42 not crossing the data line 12 broken at the a portion and the connection members 47, and the crossed portions c and f between the connection members 47 and the third repair lines 44 and 46 are irradiated by a laser beam, and short-circuited. In this case, the pictorial image signal started from the data driving IC 20 is first transmitted to the neighboring first upper repair line 41 via the short-circuited portions b, c and d. Then, the pictorial image signal is transmitted to the neighboring first lower repair line 42 via the interconnection line 50 of the PCB. Consequently, the pictorial image signal is transmitted to the side of the data line 12 below the broken portion a via the short-circuited portions g, f and e. At this time, the first repair lines 41 and 42 to be connected to the third repair lines 44 and 46 via the connection members 47 are selected from those that do not cross the broken data lines 12.

In the above structure, even though the breakage of the data lines 12 are concentrated at a particular area, the broken lines can all be repaired using the neighboring spare repair lines and the appropriate interconnection line efficiently.

Figure 3:
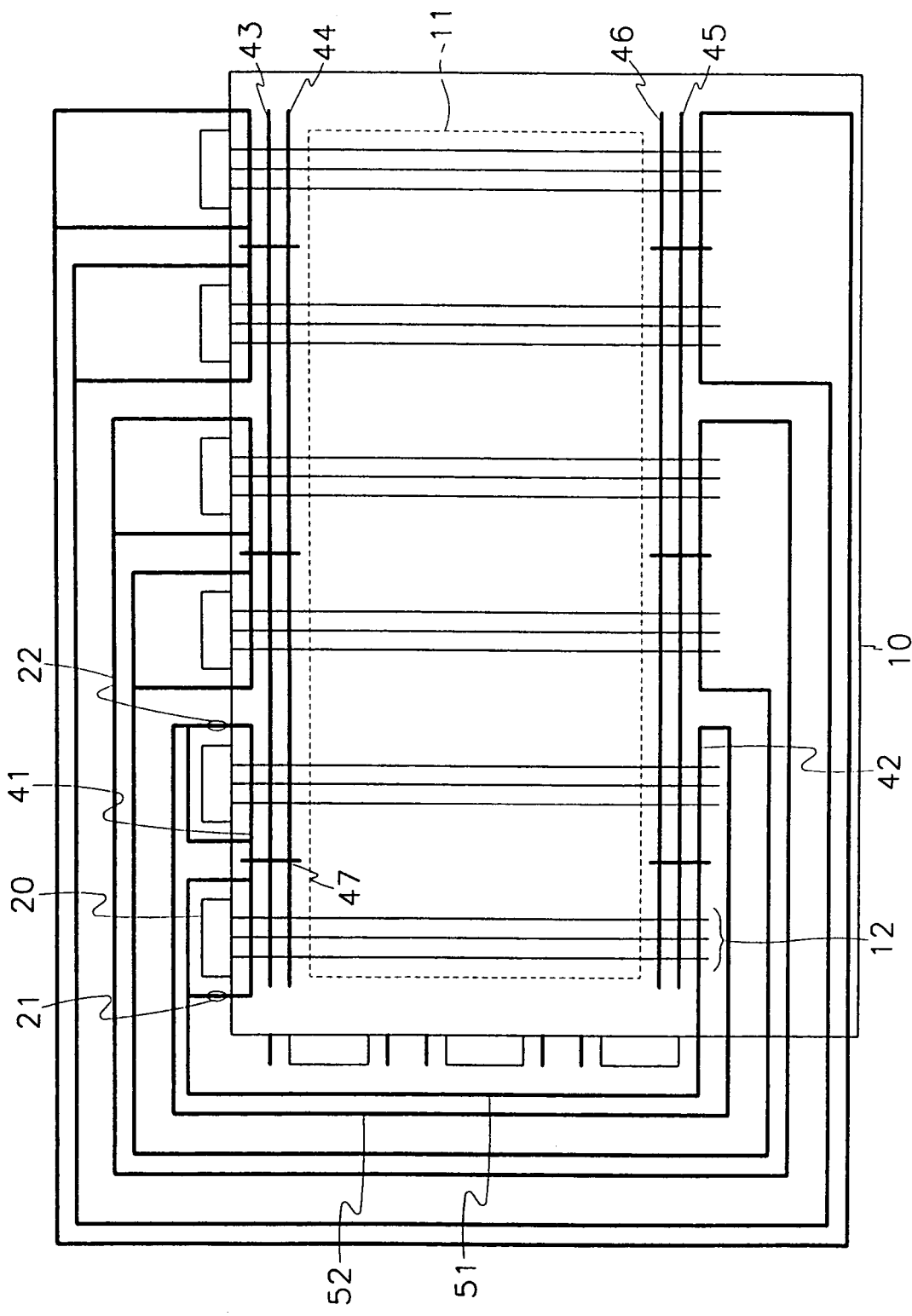
FIG. 3 is a circuit diagram of a TFT array substrate for a liquid crystal display according to a second preferred embodiment of the present invention.

FIG. 3 is a circuit diagram of a TFT array substrate according to a second preferred embodiment of the present invention. In this preferred embodiment, other components and structures of the TFT array substrate are similar to those related to the first preferred embodiment except that two interconnection lines 51 and 52 are used to interconnect the first upper and lower repair lines 41 and 42. The two interconnection lines 51 and 52 are linked to the left and right end portions of the first repair lines 41 and 42, respectively.

Figure 4:
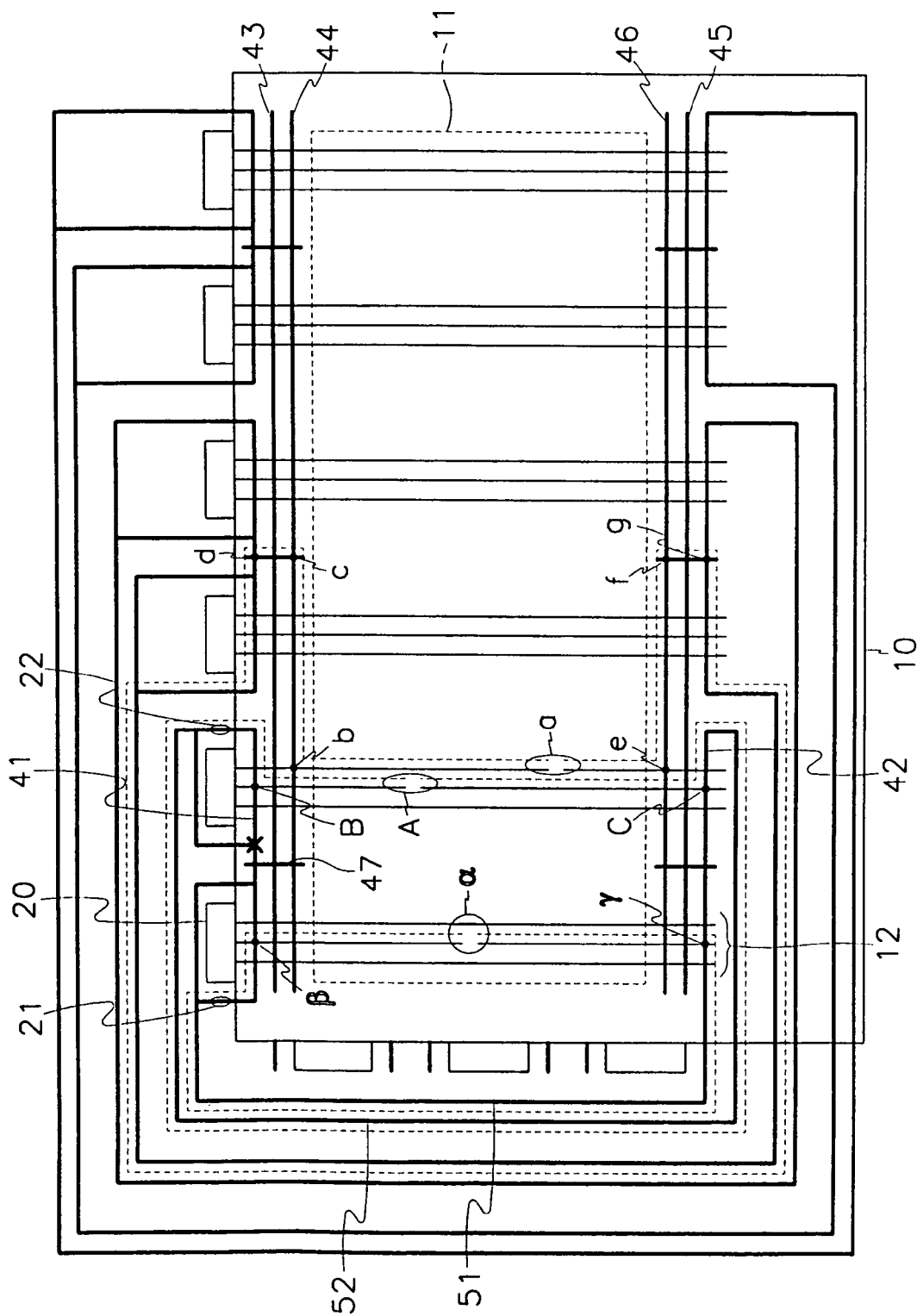
FIG. 4 illustrates the method of repairing broken lines at the TFT array substrate shown in FIG. 3.

FIG. 4 illustrates the method of repairing breakage of the data lines 12 at the TFT array substrate shown in FIG. 3 where three broken portions A, a and α are exemplified. The method of repairing the broken portions A and a is similar to the first preferred embodiment. In order to repair the broken portion α, the crossed portions between the data line 12 broken at the α portion and the upper and lower first repair lines 41 and 42 are short-circuited. Thereafter, the X portions between the short-circuited portions β and γ, and y and C of the first repair lines 41 and 42 are cut using a laser. In this case, the disconnected upper and lower portions of the three broken data lines 12 are interconnected via the route indicated by the dotted line in the drawing.

In the case of broken gate lines, the same technique can be employed for repairing them.

As described above, even though line breakage is concentrated at a particular area, such line breakages can all be repaired using the spare neighboring repair lines and the interconnection lines efficiently. Therefore, the number of interconnection lines can be significantly reduced while minimizing the volume of the PCB. Furthermore, the number of dummy pads for drawing the repair lines can also be reduced while making it possible to use common TCPs.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for repairing broken signal lines at a thin film transistor (TFT) array substrate that comprises an insulating substrate including a display area and a peripheral area surrounding the display area, the peripheral area including a first peripheral region arranged along a first edge of the display area and a second peripheral region arranged along a second edge of the display area; a plurality of signal lines formed on the insulating substrate and divided into a plurality of blocks, each block including a predetermined number of signal lines; a plurality of first repair lines formed in the first peripheral region, each crossing the signal lines of not all of the plurality of blocks; a second repair line formed in the first peripheral region and crossing all of the plurality of signal lines; a plurality of third repair lines formed in the second peripheral region and connected to the first repair lines corresponding thereto, each third repair line crossing the signal lines crossed by the corresponding first repair line; a fourth repair line formed in the second peripheral region and crossing all of the plurality of signal lines; a plurality of first connection members, each crossing the first repair line and the second repair line; a plurality of second connection members, each crossing the third repair line and the fourth repair line; and a plurality of first interconnection lines, each interconnecting the first repair line and the third repair line corresponding thereto, comprising:

shorting one of the first repair lines and a first broken signal line; and shorting one of the third repair lines and the first broken signal line.

2. The method of claim 1, further comprising:

shorting the second repair line and a second broken signal line;

shorting the fourth repair line and the second broken signal line;

shorting the second repair line and the first connection member;

shorting the first connection member and another first repair line;

shorting the fourth repair line and the second connection member; and shorting the second connection member and another third repair line.

3. The method of claim 2, wherein the thin film transistor (TFT) array substrate further comprises a plurality of second interconnection lines, wherein each second interconnection line interconnects the first repair line and the third repair line corresponding thereto.

4. The method of claim 3, wherein the first interconnection line is coupled with an end of the first repair line, and wherein an end of the third repair line and the second interconnection line is coupled with the other end of the first repair line and the other end of the second repair line.

5. The method of claim 4, further comprising:

shorting the first repair line and a third broken signal line;

shorting the third repair line and the third broken signal line;

cutting a portion of the first repair line located between the first broken signal line and the third broken signal line; and cutting a portion of the third repair line located between the first broken signal line and the third broken signal line.

* * * * *